United States Patent [19]

Vesley

[11] 4,330,590
[45] May 18, 1982

[54] PHOTOACTIVE MIXTURE OF ACRYLIC MONOMERS AND CHROMOPHORE-SUBSTITUTED HALOMETHYL-2-TRIAZINE

[75] Inventor: George F. Vesley, Hudson, Wis.

[73] Assignee: Minnesota Mining and Manufacturing Company, St. Paul, Minn.

[21] Appl. No.: 121,404

[22] Filed: Feb. 14, 1980

[51] Int. Cl.³ .............................. C08F 2/50; C08F 4/00
[52] U.S. Cl. ..................................... 428/336; 428/355;
428/345; 428/339; 544/216; 204/159.23;
430/281; 430/283; 430/260; 430/920; 427/54.1;
427/208.4; 427/384
[58] Field of Search ................... 544/216; 204/159.23;
428/40, 345, 355, 336, 339; 430/920, 281, 283,
260; 427/54.1, 208.4, 384

[56] References Cited

U.S. PATENT DOCUMENTS 3,779,778  12/1973  Smith et al. ...................... 96/115 R
3,987,037  10/1976  Bonham et al. ................. 260/240 D
4,181,752   1/1980  Martens et al. ................... 427/54.1
4,239,850  12/1980  Kita et al. .......................... 430/281

FOREIGN PATENT DOCUMENTS 675420   5/1966  Belgium .
2718259 11/1978  Fed. Rep. of Germany .

Primary Examiner—George F. Lesmes
Assistant Examiner—Alexander S. Thomas

[57] ABSTRACT

Photopolymerizable mixture of (a) acrylic monomer such as 95 parts of an alkyl acrylate and 5 parts of acrylic acid and (b) 0.01 to 2 parts by weight of a chromophore-substituted-halomethyl-s-triazine such as

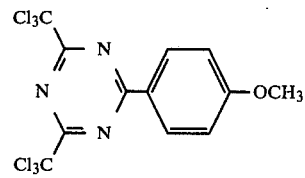

The novel mixtures are primarily useful as pressure-sensitive adhesive mixtures.

23 Claims, No Drawings

PHOTOACTIVE MIXTURE OF ACRYLIC MONOMERS AND CHROMOPHORE-SUBSTITUTED HALOMETHYL-2-TRIAZINE

BACKGROUND OF THE INVENTION

Pressure-sensitive adhesive tape is generally manufactured by coating onto a backing sheet a solution or emulsion of a pressure-sensitive adhesive polymer and heating the coating to drive off the volatile vehicle. Belgian Pat. No. 675,420 which was published May 16, 1966, concerns a process for making pressure-sensitive adhesive tape which evolves essentially no volatiles. While maintaining an inert atmosphere, a mixture of acrylic monomers and a photoinitiator is coated onto a backing sheet and then polymerized with ultraviolet radiation to a pressure-sensitive adhesive state.

U.S. Pat. No. 4,181,752 (Martens et al.) discloses a process for making pressure-sensitive adhesive tape which, like that of Belgian Pat. No. 675,420, involves the photopolymerization of acrylic monomers. While the Belgian patent discloses nothing of the specific intensity and the specific spectral distribution of the irradiation, the Martens patent discloses that these must be controlled in order to attain desirably high cohesive strength and also to attain high peel resistance. It teaches that the polymerizable mixture should be subjected to radiation in the near ultraviolet region at a rate of irradiation in the 300–400 nanometer wavelength range of not more than 7 milliwatts per square centimeter of the mass exposed. Any radiation shorter than 300 nanometers is limited to not more than about 10% of the energy in the 300–400 nanometers. Because the same specific intensity and specific spectral distribution of the irradiation are preferred for the practice of the present invention, the disclosure of the Martens patent is here incorporated by reference.

Martens teaches that the pressure-sensitive adhesive layer may be crosslinked, particularly where it is desired to increase the cohesive strength of the adhesive without unduly affecting its compliance. This can be achieved by utilizing a photoactive crosslinking agent in conjunction with the photoinitiator. Preferred as the photoactive crosslinking agent are certain chromophore-substituted vinylhalomethyl-s-triazines such as 2,4-bis(trichloromethyl)-6-p-methoxystyryl-s-triazine which has the formula

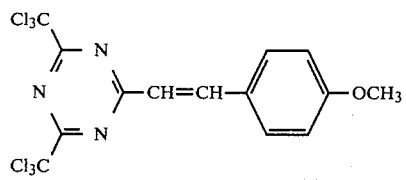

This compound is hereinafter called "MOST".

German Offenlegungsschrift No. 27 18 259 (Buhr) which was laid open Nov. 11, 1978, says that MOST and similar styryl-s-triazines are relatively complicated to prepare. It suggests that equally useful compounds can be prepared more easily, among which are

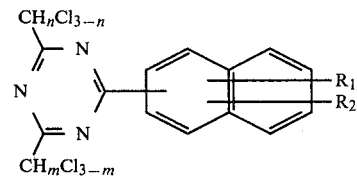

wherein each of $R_1$ and $R_2$ may be, among other things, H or alkoxy, one of $R_1$ and $R_2$ may be Cl or Br, and m and n are integers from 0 to 3 and $m+n$ does not exceed 5. U.S. Pat. No. 4,189,323 is essentially identical to the Offenlegungsschrift.

OTHER PRIOR ART

U.S. Pat. No. 3,779,778 (Smith et al.) teaches that MOST and similar styryl-s-triazines (having at least one trihalomethyl group and at least one chromophoric moiety conjugated with the triazine ring by ethylenic unsaturation) are useful as photolyzable acid progenitors for producing positive acting lithographic plates and the like. U.S. Pat. No. 3,987,037 (Bonham et al.) claims MOST and similar styryl-s-triazines and illustrates uses comparable to those shown in 3,779,778.

THE PRESENT INVENTION

As does the aforementioned Martens patent, the present invention primarily concerns a photocrosslinkable mixture of acrylic monomers such as alkyl acrylates, especially those which photopolymerize to a pressuresensitive adhesive state and become crosslinked during the photopolymerization. As in Martens the photocrosslinkable mixture includes a photoactive agent which is a chromophoresubstituted halomethyl-s-triazine, but this differs from MOST in that it has no styryl group. The photoactive s-triazine employed in the present invention can be made by a more simple and hence more economical process than can MOST, has better solubility in acrylic monomer mixtures than does MOST, and tends to provide desirably shortened reaction times and somewhat greater tolerance to oxygen. MOST tends to lend a yellowish color whereas the photoactive s-triazine employed in the invention usually produces no observable color, or in any case much less color than does MOST.

While the present invention primarily concerns (1) photopolymerizable mixtures of acrylic monomers which polymerize become crosslinked when subjected to ultraviolet radiation, it also concerns (2) photoactive mixtures of acrylic polymers which become crosslinked when subjected to ultraviolet radiation and (3) photoactive mixtures of acrylic monomers which polymerize when exposed to ultraviolet radiation without becoming crosslinked.

Specifically, the present invention concerns a photoactive mixture comprising by weight (a) 100 parts of a composition or a polymer of 50–100 parts of substituted or unsubstituted mono- or multi-functional alkyl acrylate or methacrylate monomers (all of which are hereinafter collectively referred to as "acrylic monomer") and 0–50 parts of copolymerizable monoethylenically unsaturated monomer; and (b) 0.01 to 2 parts of a chromophore-substituted halomethyl-s-triazine of the formula

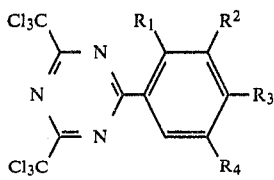

wherein $R_1$, $R_2$, $R_3$, and $R_4$ are independently hydrogen or alkoxy (preferably methoxy or ethoxy) groups, and 1 to 3 of $R_1$, $R_2$, $R_3$, and $R_4$ are hydrogen.

Preferably the alkoxy groups have not more than 12 carbon atoms (see U.S. Pat. No. 3,954,475) Preferably both $R_2$ and $R_3$ are alkoxy, because this tends to provide shorter reaction times. Adjacent alkoxy substituents may be interconnected to form a ring. The photoactive s-triazine component (b) may be prepared by the co-trimerization of an aryl nitrile with trichloroacetonitrile in the presence of HCl gas and a Lewis acid such as AlCl$_3$, AlBr$_3$, etc. [Bull. Chem. Soc. Japan, Vol. 42, page 2924 (1969)].

When photopolymerizing acrylic monomer, it may be desirable to do so stepwise. The preferred first step is to mix acrylic monomer with a photoinitiator which is not a crosslinking agent such that the dissolved amount of the photoinitiator provides up to 0.5% by weight of the mixture.

The second step is to expose the mixture to ultraviolet radiation to provide a partially-polymerized syrup having a viscosity of 300 to 20,000 centipoise at ordinary room temperature. Unless acrylic monomer were first at least partially polymerized, the viscosity of the mixture would be too low to provide uniform coatings of thicknesses most useful for pressure-sensitive adhesive tapes, e.g., 25 to 250 micrometers. The partial photopolymerizing may be stopped at any point simply by turning off the ultraviolet radiation.

The third step is to mix with said syrup the above-identified photoactive s-triazine component (b). The modified syrup may be coated onto a backing member and exposed to ultraviolet radiation to complete the polymerization. Alternatively, the third step may be performed using a syrup which has been prepared by conventional thermal polymerization techniques and has been quenched with air to attain the desired viscosity.

When an uncrosslinked polymer of acrylic monomer is mixed with the photoactive s-triazine component (b) and the mixture is exposed to ultraviolet radiation, the polymer becomes crosslinked if the acrylic monomer comprises an alkyl acrylate. For example, a pressure-sensitive adhesive polymer of an alkyl acrylate which has been polymerized in emulsion or solution may be dissolved in an organic solvent and then mixed with the photoactive s-triazine. After coating this solution onto a flexible backing member and evaporating the solvent, exposure of the coating to ultraviolet radiation causes crosslinking of the polymer. By using an opaque backing member to shield the dried coating from accidental ultraviolet radiation, the uncrosslinked tape may be marketed in commerce and eventually crosslinked by ultimate consumers.

Photoinitiators which are useful for partially polymerizing acrylic monomer without crosslinking include the benzoin ethers (such as benzoin methyl ether or benzoin isopropyl ether), substituted benzoin ethers (such as anisoin methyl ether), substituted acetophenones (such as 2,2-diethoxyacetophenone and 2,2-dimethoxy-2-phenylacetophenone), substituted alpha-ketols (such as 2-methyl-2-hydroxypropiophenone), aromatic sulfonyl chlorides (such as 2-naphthalene-sulfonyl chloride) and photoactive oximes [such as 1-phenyl-1,1-propanedione-2-(O-ethoxycarbonyl)oxime]. They may be used in amounts which as dissolved provide about 0.001 to 0.5 percent by weight of the alkyl acrylate or methacrylate monomer, preferably at least 0.01 percent.

After adding the above-identified photoactive s-triazine component (b) to acrylic monomer, whether or not partially polymerized to provide a coatable syrup, the polymerization quickly goes to completion when subjected to ultraviolet radiation. If the acrylic monomer comprises alkyl acrylate, the polymer simultaneously becomes crosslinked. Although the polymerization is exothermic, coatings as thick as 0.5 mm have been quickly polymerized uniformly. To form uniform, bubble-free layers of greater thickness from acrylic monomer, either the amount of the photoactive s-triazine component (b) should be kept below about 0.5% by weight of the above-identified composition (a) or the intensity of radiation should be reduced so that polymerization proceeds more slowly.

The extent of polymerization can be monitored by measuring the refractive index of the polymerizable mixture. For example, the refractive index may change from about 1.43 for a partially polymerized syrup to about 1.47 at about 100% reaction. The change in refractive index occurs linearly with conversion of the unsaturated moiety. See, for example, discussions about the method in *Polymerization at Advanced Degrees of Conversion,* G. P. Gladyshev and K. M. Gibov, Keter Press, Jerusalem, 1970.

Alkyl acrylates wherein the alkyl group has 4–12 carbon atoms are readily photopolymerized in the practice of the invention to a pressure-sensitive adhesive state, either alone or in combination with various copolymerizable monoethylenically unsaturated monomers, usually at ratios of about 88–99 parts of the alkyl acrylate or acrylates and correspondingly 12–1 parts by weight of the copolymerizable monomer or monomers.

While the present invention is primarily concerned with pressure-sensitive adhesive tapes, the tack-free products can be used as photo-resists as in the aforementioned U.S. Pat. No. 3,779,778 or as viscoelastic damping material in such applications as in U.S. Pat. No. 3,605,953 (Caldwell et al.) Multifunctional alkyl acrylates such as hexanediol diacrylate and trimethylolpropane triacrylate provide tack-free products. In the absence of alkyl acrylate, alkyl methacrylates also photopolymerize to a tack-free state but without noticeable crosslinking.

In order to enhance the internal strength of polymerized products of the invention, whether or not they are tack-free, the acrylic monomer should include one or more copolymerizable monoethylenically unsaturated monomers which have highly polar groups such as are present in acrylic acid, methacrylic acid, itaconic acid, acrylamide, methacrylamide, N-substituted acrylamides, acrylonitrile, methacrylonitrile, hydroxyalkyl acrylates, cyanoethyl acrylate, N-vinylpyrrolidone, and maleic anhydride. Other useful copolymerizable monoethylenically unsaturated monomers include alkyl vinyl ethers, vinylidene chloride, styrene, and vinyltoluene.

Other materials which can be blended with the photoactive mixture of this invention include tackifiers, reinforcing agents, and other modifiers, some of which may copolymerize with the acrylic monomer or photopolymerize independently.

Glass microbubbles having an average diameter of 10 to 200 micrometers can be blended with photoactive mixtures of this invention which polymerize to a pressuresensitive adhesive state as taught in U.S. Pat. No. 4,223,067 (Levens). If the microbubbles comprise 20 to 65 volume percent of the pressure-sensitive adhesive, the polymerized product will have a foam-like appearance and be suitable for uses to which foam-backed pressure-sensitive adhesive tapes are put.

In the current state of the art, photopolymerization is carried out in an inert atmosphere. Any inert atmosphere such as nitrogen, carbon dioxide, helium or argon is suitable and, as noted above, some oxygen can be tolerated. A sufficiently inert atmosphere can be achieved by covering a layer of the photoactive mixture with a plastic film which is transparent to ultraviolet radiation and irradiating through that film in air.

The peak wavelength of the ultraviolet radiation preferably is close to the wavelength of maximum absorption of the photoactive s-triazine component (b). Good results have been attained using a bank of 40-watt fluorescent black lamps. General Electric and Sylvania each market such a lamp designated "F40BL-Black Light". The GE lamp emits mainly between 310 nm and 430 nm with a maximum at 380 nm. The Sylvania lamp emits mainly between 310 nm and 400 nm with a maximum at 365 nm. Good results have also been obtained with mercury lamps, namely 400 watt and 1000 watt medium-pressure street lights (General Electric HID H400A-33-1). While the fluorescent lamps have been mounted within the chamber which provides an inert atmosphere, the mercury lamps are hotter and were mounted outside the chamber. A sheet of 0.6-cm heat-resistant glass placed 1.3 cm above the coating to be polymerized served to seal the chamber and to filter out radiation below 310 nm.

In using the fluorescent lamps, the operating intensity has usually been adjusted to 2-4 milliwatts/cm$^2$ at a distance of 12.5 cm from the coating. The mercury street lights provided an intensity of about 2 milliwatts/cm$^2$. The intensity of the irradiation was measured with a United Detector Technology 80X Opto-Meter radiometer which had a sandblasted fused silica diffuser, a Kodak 18A filter, and a silicon photodiode. The filter transmitted light between 300 and 400 nanometers. The radiometer was calibrated in accordance with the spectral output of each lamp.

Pressure-sensitive adhesive tapes of the examples below employed as the backing member biaxially-oriented polyethylene terephthalate film having a thickness of about 2 mils (50 micrometers). Each tape was slit to a width of ½ inch (1.27 cm) and had an adhesive thickness of about 2 mils (50 micrometers). Tapes of Examples 1-18 were tested for Peel Value and Shear Value as indicated below. All failures in the tests for Shear Value were cohesive.

Peel Value

Tape is adhered by its adhesive to a glass plate under the weight of a 4.5-kg hard rubber roller. Peelback at 180° is measured by attaching the free end of the tape to a scale and moving the glass plate away from the scale at a rate of about 3.8 centimeters per second.

Shear Value

A strip of tape is adhered by its adhesive to a stainless steel plate under the weight of a 4.5-kg hard rubber roller with a free end of the tape extending beyond the plate and the adhesive contact area being ½ inch by ½ inch (1.27 cm by 1.27 cm). After 30 minutes, the plate is placed in an oven at 70° C. and positioned 2° from the vertical to prevent peeling. After 10 minutes in the oven, a one kg mass is suspended from the free end, and the time at which the mass falls is noted. The test is discontinued if the tape has not failed after 10,000 minutes.

EXAMPLES 1 TO 11 AND COMPARATIVE EXAMPLES 1-C to 7-C

A series of pressure-sensitive adhesive tapes were made by partially photopolymerizing a mixture of, by weight, 90 parts of isooctyl acrylate
10 parts of acrylic acid
0.1 part of 2,2-dimethoxy-2-phenyl acetophenone, which has the structure

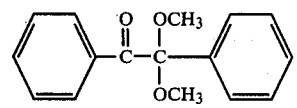

and which was obtained as "Irgacure" 651.

The partial photopolymerizing was accomplished in an inert (nitrogen) atmosphere using a bank of 40-watt fluorescent black lights (GE as described above) to provide coatable syrups of a viscosity (Brookfield) of about 1500 cps. A photoactive s-triazine was added to each syrup, sometimes together with additional "Irgacure" 651, and thoroughly mixed. Each mixture was coated using a conventional knife coater onto biaxially-oriented polyethylene terephthalate film. The coated film was passed through an inert (nitrogen) chamber and irradiated with the same fluorescent lamps to provide pressure-sensitive adhesive layers. The examples employed the photoactive s-triazines of Table I:

TABLE I

| Photoactive s-triazine | M.P. °C. | Maximum absorption wavelength in CH$_2$Cl$_2$ (nanometers) | Extinction coefficient $\epsilon \times 10^{-3}$ |
|---|---|---|---|
| MOST | 190-192 | 377 | 28 |
| A  Cl$_3$C—⟨N=⟩—⟨⟩—OCH$_3$ ⟨=N⟩ Cl$_3$C | 145-147 | 330 | 22 |
| B  Cl$_3$C—⟨N=⟩—⟨⟩(OCH$_3$)—OCH$_3$ ⟨=N⟩ Cl$_3$C | 150-151 | 353 | 16.5 |

TABLE I-continued

| Photoactive s-triazine | M.P. °C. | Maximum absorption wavelength in CH₂Cl₂ (nanometers) | Extinction coefficient $\epsilon \times 10^{-3}$ |
|---|---|---|---|
| C 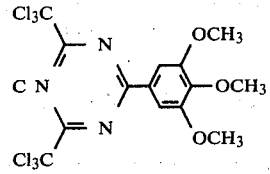 | 158–160 | 345 | 5.2 |
| D 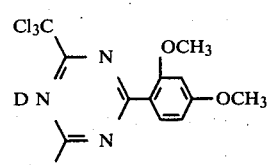 | 120–123 | 350 | 3.2 |
| E 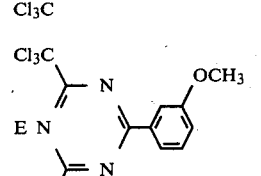 | 90–91 | 345 | 3.9 |
| F 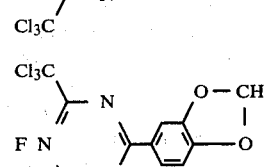 | 134–135 | 356 | 17.8 |

Structures of the photoactive s-triazines in Table I were confirmed by infrared, nuclear magnetic resonance, and mass spectroscopy. Conditions of the chamber atmosphere, the amount of any additional "Irgacure" 651, the exposure, and the Shear Values in minutes are reported in Table II. All of the tapes had Peel Values of 50–60 ounces per ½ inch (110–130 N/100 nm).

| Example No. | Photoactive s-triazine Identity | Wtg. % | Oxygen In Chamber (ppm) | Added Irgacure Wgt. % | Exposure (mj) | Shear Value (min) |
|---|---|---|---|---|---|---|
| 1-C | MOST | 0.10 | 100 | 0.15 | 360 | 90 |
| 2-C | MOST | 0.10 | 20 | 0 | 450 | 10,000 |
| 3-C | MOST | 0.20 | 20 | 0.25 | 450 | 10,000 |
| 4-C | MOST | 0.10 | 20 | 0.25 | 450 | 1,100 |
| 5-C | MOST | 0.10 | 300 | 0 | 450 | 225 |
| 6-C | MOST | 0.10 | 300 | 0.25 | 450 | 2,800 |
| 7-C | MOST | 0.20 | 300 | 0 | 450 | 10,000 |
| 1 | A | 0.05 | 300 | 0 | 450 | 10,000 |
| 2 | A | 0.10 | 100 | 0 | 150 | 900 |
| 3 | A | 0.15 | 100 | 0 | 150 | 10,000 |
| 4 | A | 0.10 | 100 | 0 | 225 | 10,000 |
| 5 | B | 0.10 | 100 | 0 | 166 | 10,000 |
| 6 | B | 0.15 | 100 | 0 | 150 | 10,000 |
| 7 | B | 0.2 | 100 | 0 | 125 | 10,000 |
| 8 | C | 0.2 | 30 | 0 | 140 | 10,000 |
| 9 | D | 0.2 | 30 | 0.1 | 200 | 10,000 |
| 10 | E | 0.2 | 30 | 0.1 | 300 | 10,000 |
| 11 | F | 0.2 | 30 | 0.1 | 200 | 10,000 |

EXAMPLES 12 TO 14

A series of pressure-sensitive adhesive tapes were prepared and irradiated as in Example 1 to 11 except using different acrylic monomers and various photoactive s-triazines as indicated in Table III, except that each photopolymerizable mixture of Examples 12 to 14 employed 0.15 part of Photoactive s-triazine B, Comparative Examples 12-C to 14-C included no photoactive s-triazine, and Example 14 and Comparative Example 14-C included 0.2 part of 2,2-dimethoxy-2-phenylacetophenone.

TABLE III

| Example No. | Acrylic Monomers | Photoactive s-triazine | Shear Value (min) |
|---|---|---|---|
| 12 | isooctylacrylate: acrylic acid: 2-cyanoethyl acrylate (74:10:16) | B | 10,000 |
| 12-C | isooctylacrylate: acrylic acid: 2-cyanoethyl acrylate (74:10:16) | None | 30 |
| 13 | isooctylacrylate: acrylic acid (94:6) | B | 10,000* |
| 13-C | isooctylacrylate: acrylic acid (94:6) | None | 8* |
| 14 | isooctylacrylate: N(n-butyl)acrylamide (66:34) | B | 2,400** |
| 14-C | isooctylacrylate: N(n-butyl)acrylamide (66:34) | None | **42 |

*adhesive contact area ½ by 1 inch (1.27 by 2.54 cm)
**adhesive contact area ½ by 1 inch (1.27 by 2.54 cm) and tested at room temperature

EXAMPLE 15 AND COMPARATIVE EXAMPLE 15-C

A pressure-sensitive adhesive tape was prepared from a 50% solution in heptane/toluene/methanol 56/24/20 of a 95:5 polymer of 2-ethylhexyl acrylate:acrylamide which had been solution-polymerized to substantially 100% conversion. Photoactive s-triazine B was added to the solution (0.165% of dry weight adhesive) and thoroughly mixed. This was knife-coated [4-mil (0.1 mm) orifice] onto a backing member, dried at 135° C. for 5 minutes, and then irradiated in air using a standard medium-pressure mercury lamp (300 watts/inch) at 30 m/min. (350 mj/cm²). The irradiated tape (Example 15) and an otherwise identical unirradiated tape (Comparative Example 15-C) had Shear Values [except measured at room temperature and a contact area of ½ by 1 inch (1.27 cm by 2.54 cm)] of 10,000 and 100 minutes, respectively.

EXAMPLE 16 AND COMPARATIVE EXAMPLE 16-C

A pressure-sensitive adhesive tape was prepared as in Example 15, except that a 94:6 polymer of 2-ethylhexyl acrylate:acrylamide was used and Photoactive s-triazine A was used instead of Photoactive s-triazine B and in an amount of 0.2% of dry weight adhesive, and the solvent was removed by vacuum and heat at a temperature less than 160° C. The dried adhesive was hot-melt coated to a thickness of 2 mils (0.05 mm) and then irradiated in air using the same lamp as in Example 15 at half the web speed (700 mj/cm$^2$). The irradiated tape (Example 16) and an unirradiated tape (Comparative Example 16-C) had Shear Values (measured as in Example 15) of 10,000 and 400 minutes, respectively.

EXAMPLE 17 AND COMPARATIVE EXAMPLE 17-C

A polymer of isooctyl acrylate and acrylic acid (95.5:4.5) was prepared by a conventional emulsion-polymerization technique. The polymer was dried and redissolved in 70:30 heptane:isopropanol, 25% solids. To 100 parts of the solution was added 0.05 part of Photoactive s-triazine B, and this was thoroughly mixed. The mixture was knife-coated [10-mil (0.25 mm) orifice] onto a backing member and dried at 70° C. for 5 minutes. The resulting pressure-sensitive adhesive layer was exposed in the presence of air to ultraviolet irradiation as described in Examples 1–11. The irradiated tape (Example 17) and an otherwise identical unirradiated tape (Comparative Example 17-C) were tested for Peel Value and Shear Value [except ½ by 1 inch (1.25 by 2.54 cm) contact area] with results indicated below:

| Tape of | Peel Value (N/100 mm) | Shear Value (minutes) |
|---|---|---|
| Example 17 | 37 | 10,000 |
| Comparative Example 17-C | 37 | 2 |

EXAMPLE 18 AND COMPARATIVE EXAMPLE 18-C

Tapes were prepared from a commercial pressure-sensitive adhesive which is understood to be a copolymer comprising a major proportion of 2-ethylhexyl acrylate and minor proportions of vinyl acetate, ethyl acrylate and acrylic acid (Ashland "Aroset" 1044-Z-40). This was obtained as a 40% solution, diluted with toluene to 20% solids, and Photoactive s-triazine B (0.15% of dry weight adhesive) was added. After thorough mixing, the solution was knife-coated (0.4-mm orifice) onto a backing member and dried at 70° C. for 15 minutes. The resultant tape (Example 18) was irradiated as in Examples 1–11 in comparison to an unirradiated tape (Examples 18-C) which was identical except that it did not have any photoactive component. Test results were

| Tape of | Shear Value (minutes) |
|---|---|
| Example 18 | 4380 |
| Comparative Example 18-C | 365 |

In each of the pressure-sensitive adhesive tapes of Examples 1 to 18, the adhesive layer was permanently bonded to the polyethylene terephthalate backing member. For many potential uses of the invention, the adhesive layer would be formed on a backing member having a low-adhesion layer from which the adhesive layer could be transferred.

EXAMPLES 19 TO 22 AND COMPARATIVE EXAMPLES 19-C TO 22-C

To investigate further the crosslinking ability of the photoactive s-triazines, polymers were prepared by mixing "Irgacure" 651 (identified in Examples 1–11) or a photoactive s-triazine with various acrylic monomers. Each mixture was purged with nitrogen and irradiated with a bank of 40-watt fluorescent black lights (GE as described above) until substantially complete conversion of the unsaturated moiety. Solubility of the resulting polymers was tested in ethyl acetate after shaking at room temperature for 24 hours, except that Example 20 and Comparative Example 20-C were tested in ethyl acetate/methanol (90/10). Results are shown in Table IV.

TABLE IV

| Example No. | Acrylic monomers | Photoactive s-triazine (Identity) | Photoactive s-triazine (Wgt %) | Irgacure (Wgt %) | Solubility |
|---|---|---|---|---|---|
| 19 | isooctyl acrylate | B | 0.15 | 0 | gel |
| 19-C | | | 0 | 0.2 | soluble |
| 20 | isooctyl acrylate: | F | 0.15 | 0 | gel |
| 20-C | acrylic acid (70:30) | | 0 | 0.2 | soluble |
| 21 | isooctyl acrylate: | B | 0.15 | 0 | gel |
| 21-C | n-octyl methacrylate (80:20) | | 0 | 0.2 | soluble |
| 22 | n-butyl acrylate | B | 0.15 | 0 | gel |
| 22-C | | | 0 | 0.2 | soluble |

NOVEL S-TRIAZINES

Although Photoactive s-triazines A and F are known in the prior art, B through E of Table II are believed to be new. Of these, surprisingly beneficial results have been achieved when using a chromophore-substituted halomethyl-s-triazine of the formula

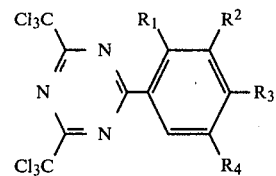

wherein $R_2$ and $R_3$ are alkoxy and at least one of $R_1$ and $R_4$ is hydrogen and the other is alkoxy or hydrogen.

Experiments tend to indicate that such s-triazines provide significantly shortened reaction times as compared to Photo-active s-triazine A. This may be in part due to better matching of the maximum absorption wavelength of the s-triazine to the peak wavelengths of commercially available ultraviolet lamps while retaining desirably high extinction coefficients.

The $R_2$ and $R_3$ substituents may be interconnected to form a ring, specifically

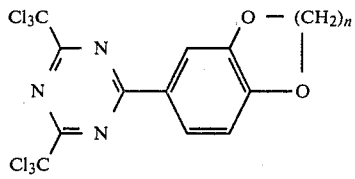

wherein n is 1, 2 or 3. This improves solubility in acrylic monomer. The solubilities of Photoactive-s-triazines A and F are about equal and appreciably better than that of Photoactive-s-triazine B.

I claim:

1. Method comprising the steps of
   (1) mixing by weight
   (a) 100 parts of a composition or a polymer of 50–100 parts of acrylic monomer and 0–50 parts of copolymerizable monoethylenically unsaturated monomer and
   (b) 0.01 to 2 parts of a chromophore-substituted halomethyl-s-triazine of the formula

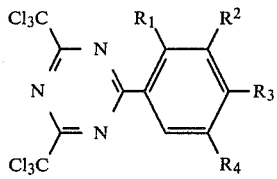

wherein $R_1$, $R_2$, $R_3$, and $R_4$ are independently hydrogen or alkoxy groups, and 1 to 3 of $R_1$, $R_2$, $R_3$, and $R_4$ are hydrogen,
   (2) applying the mixture to a substrate,
   (3) exposing the applied mixture to ultraviolet radiation.

2. Method as defined in claim 1 wherein said composition or polymer (a) consists essentially of a partially polymerized composition having a coatable viscosity of 300 to 20,000 centipoises at ordinary room temperature, step (2) involves coating said mixture onto a flexible backing member, and in step (3) the coated mixture is photopolymerized.

3. Method as defined in claim 1 wherein said composition or polymer (a) is a polymer of an alkyl acrylate, step (2) involves coating onto a flexible backing member a solution of said polymer in an organic solvent, there is an additional step between steps (2) and (3) involving driving off the solvent, and in step (3) the polymer becomes crosslinked.

4. Method as defined in either of claim 2 or claim 3 wherein said composition or polymer (a) is selected such that the applied mixture after being exposed to ultraviolet radiation in step (3) is in a pressure-sensitive adhesive state.

5. The product of the method of claim 1.

6. Method of making a polymer comprising the steps of:
   (1) mixing by weight
   (a) 100 parts of an unpolymerized composition of 50–100 parts of acrylic monomer and 0–50 parts of copolymerizable monoethylenically unsaturated monomer and
   (b) an addition-polymerization photoinitiator which is activatable by ultraviolet radiation, is not a crosslinking agent, and is dissolved in an amount providing 0.001 to 0.5 percent of the composition (a),
   (2) exposing the mixture to ultraviolet radiation to provide a partially-polymerized syrup having a viscosity of 300 to 20,000 centipoises at ordinary room temperature,
   (3) mixing with said syrup 0.01 to 2 parts of a chromophore-substituted halomethyl-s-triazine of the formula

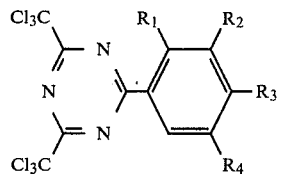

wherein $R_1$, $R_2$, $R_3$, and $R_4$ are independently hydrogen or alkoxy groups, and 1 to 3 of $R_1$, $R_2$, $R_3$, and $R_4$ are hydrogen,
   (4) coating said syrup onto a backing member to provide a layer having a thickness of about 25–250 micrometers, and
   (5) in an inert atmosphere, irradiating the coating with ultraviolet radiation to further polymerize it to a substantially completely polymerized, crosslinked state.

7. The product of the method of claim 6.

8. Method of making a flexible pressure-sensitive adhesive tape comprising the steps of:
   (1) mixing by weight
   (a) an unpolymerized composition of (i) 88–99 part of alkyl acrylate having 4–12 carbon atoms in its alkyl group or alkyl acrylates having an average of 4–12 carbon atoms in their alkyl groups and (ii) correspondingly 1–12 parts of a copolymerizable monomer, which composition is polymerizable to a pressure-sensitive state and
   (b) an addition-polymerization photoinitiator which is activatable by ultraviolet radiation, is not a crosslinking agent, and is dissolved in an amount providing 0.001 to 0.5 percent of the composition (a),
   (2) exposing the mixture to ultraviolet radiation to provide a partially-polymerized syrup having a viscosity of 300 to 20,000 centipoises at ordinary room temperature,
   (3) mixing with said syrup 0.01 to 2 parts of a chromophore-substituted halomethyl-s-triazine of the formula

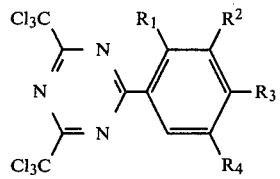

wherein $R_1$, $R_2$, $R_3$, and $R_4$ are independently hydrogen or alkoxy groups, and 1 to 3 of $R_1$, $R_2$, $R_3$, and $R_4$ is hydrogen,
   (4) coating said modified syrup onto a flexible backing member to provide a layer having a thickness of about 25–250 micrometers, and (5) in an inert atmosphere, irradiating the coating with ultraviolet radiation to further polymerize it to a pressure-sensitive adhesive state.

9. A flexible pressure-sensitive adhesive tape produced by the method defined in claim 8.

10. A substrate having a coating comprising a photopolymerized mixture which comprises by weight
    (a) 100 parts of acrylic monomer and 0–50 parts of copolymerizable monoethylenically unsaturated monomer and
    (b) 0.01 to 2 parts of a chromophore-substituted halomethyl-s-triazine of the formula

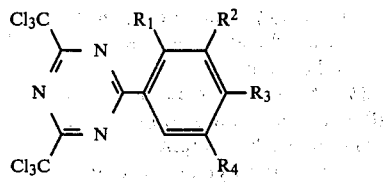

wherein $R_1$, $R_2$, $R_3$, and $R_4$ are independently hydrogen or alkoxy groups, and 1 to 3 of $R_1$, $R_2$, $R_3$, and $R_4$ are hydrogen.

11. A coated substrate as defined in claim 10 wherein said alkoxy groups have at most 12 carbon atoms.

12. A coated substrate as defined in claim 11 wherein at least two of said groups are alkoxy.

13. A coated substrate as defined in claim 12 wherein two adjacent alkoxy groups are interconnected to form a ring.

14. A coated substrate as defined in claim 11 wherein said coating when applied had a viscosity of 300 to 20,000 centipoises at ordinary room temperature.

15. A coated substrate as defined in claim 11 wherein said composition or polymer (a) is a polymer of an alkyl acrylate.

16. A tape comprising a flexible backing member and a coating obtained by photopolymerizing a mixture comprising by weight
    (a) 100 parts of a composition or a polymer of 50–100 parts of acrylic monomer and 0–50 parts of copolymerizable monoethylenically unsaturated monomer and
    (b) 0.01 to parts of a chromophore-substituted halomethyl-s-triazine of the formula

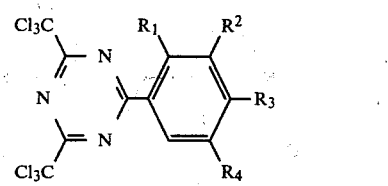

wherein $R_1$, $R_2$, $R_3$, and $R_4$ are independently hydrogen or alkoxy groups, and 1 to 3 of $R_1$, $R_2$, $R_3$, and $R_4$ are hydrogen.

17. A roll of tape as defined in claim 16 wherein the flexible backing member is opaque in order to shield said photoactive mixture from accidental ultraviolet radiation.

18. Pressure-sensitive adhesive tape comprising a backing member and a pressure-sensitive adhesive coating obtained by photopolymerizing a mixture comprising by weight
    (a) a composition or partially polymerized composition of (1) 88–99 parts of alkyl acrylate having 4–12 carbon atoms in its alkyl groups or alkyl acrylates having an average of 4–12 carbon atoms in their alkyl groups and (2) correspondingly 12–1 parts of said copolymerizable monomer, which composition is polymerizable to a pressure-sensitive adhesive state, and
    (b) 0.01 to 2 parts of a chromophore-substituted halomethyl-s-triazine of the formula

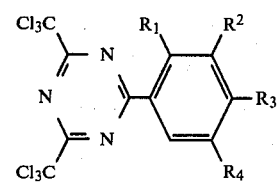

wherein $R_1$, $R_2$, $R_3$, and $R_4$ are independently hydrogen or alkoxy groups, and 1 to 3 of $R_1$, $R_2$, $R_3$, and $R_4$ are hydrogen.

19. Pressure-sensitive adhesive tape as defined in claim 18 wherein at least part of said copolymerizable monomer has highly polar group.

20. A substrate having a coating comprising a photopolymerized mixture which comprises by weight
    (a) 100 parts of acrylic monomer and 0–50 parts of copolymerizable monoethylenically unsaturated monomer and
    (b) 0.01 to 2 parts of a chromophore-substituted halomethyl-s-triazine selected from the group consisting of

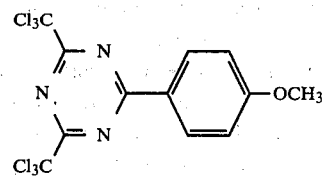

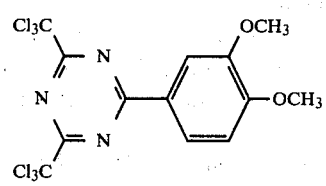

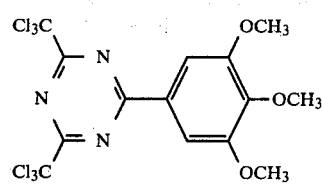

21. Method comprising the steps of
    (1) mixing by weight
        (a) 100 parts of a composition or a polymer of 50–100 parts of acrylic monomer and 0–50 parts of copolymerizable monoethylenically unsaturated monomer and
        (b) 0.01 to 2 parts of a chromophore-substituted halomethyl-s-triazine selected from the group consisting of

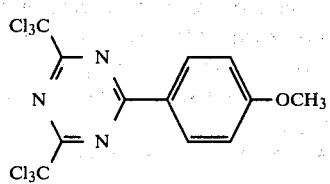

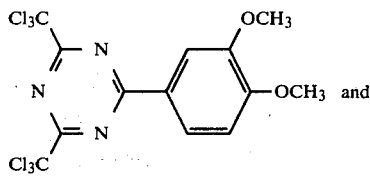 and

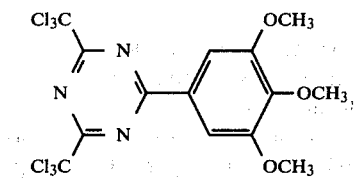

(2) applying the mixture to a substrate, (3) exposing the applied mixture to ultraviolet radiation.

22. Method of making a polymer comprising the steps of:

(1) mixing by weight
(a) 100 parts of an unpolymerized composition of 50–100 parts of acrylic monomer and 0–50 parts of copolymerizable monoethylenically unsaturated monomer and
(b) an addition-polymerization photoinitiator which is activatable by ultraviolet radiation, is not a crosslinking agent, and is dissolved in an amount providing 0.001 to 0.5 percent of the composition (a), (2) exposing the mixture to ultraviolet radiation to provide a partially-polymerized syrup having a viscosity of 300 to 20,000 centipoises at ordinary room temperature, (3) mixing with said syrup 0.01 to 2 parts of a chromophore-substituted halomethyl-s-triazine selected from the group consisting of

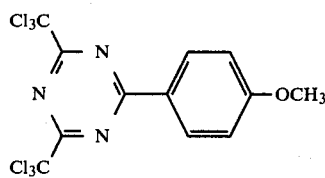

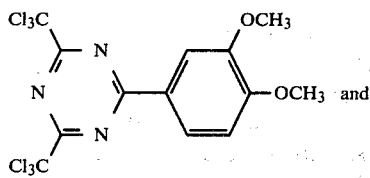 and

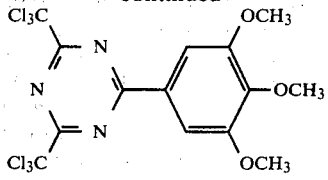

(4) coating said syrup onto a backing member to provide a layer having a thickness of about 25–250 micrometers, and (5) in an inert atmosphere, irradiating the coating with ultraviolet radiation to further polymerize it to a substantially completely polymerized, crosslinked state.

23. Method of making a flexible pressure-sensitive adhesive tape comprising the steps of:

(1) mixing by weight
(a) an unpolymerized composition of (i) 88–99 part of alkyl acrylate having 4–12 carbon atoms in its alkyl group or alkyl acrylates having an average of 4–12 carbon atoms in their alkyl groups and (ii) correspondingly 1–12 parts of a copolymerizable monomer, which composition is polymerizable to a pressure-sensitive state and
(b) an addition-polymerization photoinitiator which is activatable by ultraviolet radiation, is not a crosslinking agent, and is dissolved in an amount providing 0.001 to 0.5 percent of the composition (a), (2) exposing the mixture to ultraviolet radiation to provide a partially-polymerized syrup having a viscosity of 300 to 20,000 centipoises at ordinary room temperature, (3) mixing with said syrup 0.01 to 2 parts of a chromophore-substituted halomethyl-s-triazine selected from the group consisting of

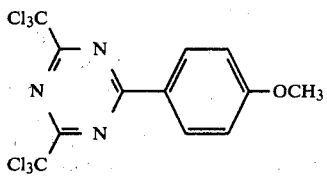

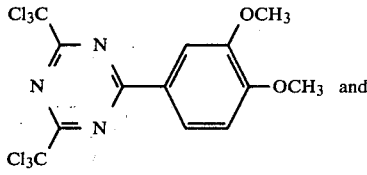 and

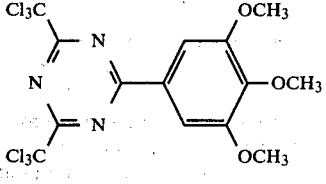

(4) coating said modified syrup onto a flexible backing member to provide a layer having a thickness of about 25–250 micrometers, and (5) in an inert atmosphere, irradiating the coating with ultraviolet radiation to further polymerize it to a pressure-sensitive adhesive state.

* * * * *